(12) United States Patent
Jiang et al.

(10) Patent No.: US 8,920,934 B2
(45) Date of Patent: Dec. 30, 2014

(54) HYBRID SOLDER AND FILLED PASTE IN MICROELECTRONIC PACKAGING

(71) Applicants: Hongjin Jiang, Chandler, AZ (US); Arun Kumar C. Nallani, Chandler, AZ (US); Rajen S. Sidhu, Chandler, AZ (US); Martha A. Dudek, Chandler, AZ (US); Weihua Tang, Chanderl, AZ (US)

(72) Inventors: Hongjin Jiang, Chandler, AZ (US); Arun Kumar C. Nallani, Chandler, AZ (US); Rajen S. Sidhu, Chandler, AZ (US); Martha A. Dudek, Chandler, AZ (US); Weihua Tang, Chanderl, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/853,982

(22) Filed: Mar. 29, 2013

(65) Prior Publication Data

US 2014/0291843 A1    Oct. 2, 2014

(51) Int. Cl.
    *B32B 5/18*      (2006.01)
    *H01L 23/498*    (2006.01)
    *H01L 23/00*     (2006.01)

(52) U.S. Cl.
    CPC .......... *H01L 23/49816* (2013.01); *H01L 24/81* (2013.01); *Y10S 428/929* (2013.01)
    USPC ............ 428/613; 428/570; 428/929; 257/772

(58) Field of Classification Search
    CPC ... H01L 2224/00; H05K 2203/00; H05K 3/00
    USPC .......... 257/E21.508, E23.021, E23.106, 779, 257/780, 737, 738, 772, 781
    See application file for complete search history.

(56) References Cited

U.S. PATENT DOCUMENTS

| 5,331,591 | A | * | 7/1994 | Clifton .......................... 365/182 |
| 5,369,551 | A | * | 11/1994 | Gore et al. ..................... 361/767 |
| 5,386,341 | A | * | 1/1995 | Olson et al. .................... 361/749 |
| 5,466,635 | A | * | 11/1995 | Lynch et al. ................... 438/614 |
| 5,573,172 | A | * | 11/1996 | Gore ......................... 228/180.22 |
| 5,690,270 | A | * | 11/1997 | Gore ......................... 228/180.22 |
| 5,698,465 | A | * | 12/1997 | Lynch et al. ................... 438/125 |
| 5,872,404 | A | * | 2/1999 | Lynch et al. ................... 257/781 |
| 6,011,693 | A | * | 1/2000 | Gore ............................. 361/760 |
| 6,080,936 | A | * | 6/2000 | Yamasaki et al. .............. 174/263 |
| 6,115,913 | A | * | 9/2000 | Yamasaki et al. ............. 29/843 |
| 6,127,735 | A | * | 10/2000 | Berger et al. ................. 257/778 |

(Continued)

OTHER PUBLICATIONS

Yazzie et al. "Rate Dependendt Behavior of Sn Alloy-Cu Couples: Effects of Microstructure and Composition on Mechanical Shock Resistance" Mar. 2012. Arizona State University, pp. 1-49.*

(Continued)

*Primary Examiner* — Telly Green
(74) *Attorney, Agent, or Firm* — Blakely, Sokoloff, Taylor & Zafman LLP

(57) ABSTRACT

Hybrid solder for solder balls and filled paste are described. A solder ball may be formed of a droplet of higher temperature solder and a coating of lower temperature solder. This may be used with a solder paste that has an adhesive and a filler of low temperature solder particles, the filler comprising less than 80 weight percent of the paste. The solder balls and paste may be used in soldering packages for microelectronic devices. A package may be formed by applying a solder paste to a bond pad of a substrate, attaching a hybrid solder ball to each pad using the paste, and attaching the package substrate to a microelectronic substrate by reflowing the hybrid solder balls to form a hybrid solder interconnect.

16 Claims, 8 Drawing Sheets

(56) References Cited

U.S. PATENT DOCUMENTS

| | | | |
|---|---|---|---|
| 6,148,900 A * | 11/2000 | Yamasaki et al. | 164/80 |
| 6,340,630 B1 * | 1/2002 | Berger et al. | 438/613 |
| 7,473,580 B2 * | 1/2009 | Farooq et al. | 438/108 |
| 7,745,013 B2 * | 6/2010 | Choe et al. | 428/613 |
| 2002/0000462 A1 * | 1/2002 | Mead et al. | 228/248.1 |
| 2007/0152016 A1 * | 7/2007 | Choe et al. | 228/56.3 |
| 2007/0269928 A1 * | 11/2007 | Farooq et al. | 438/108 |
| 2008/0224328 A1 * | 9/2008 | Farooq et al. | 257/782 |
| 2014/0065771 A1 * | 3/2014 | Gruber et al. | 438/121 |

OTHER PUBLICATIONS

Fei et al. "Modeling of Sn-Rich(Pb-Free) Solder Joints Under Mechanical Shock Conditions" Apr. 10, 2012, Journal of Electronic Materials.*

* cited by examiner

HYBRID SOLDER AND FILLED PASTE IN MICROELECTRONIC PACKAGING

FIELD

The present description is related to soldering connections in microelectronic structures and, in particular, to paste and solder ball structures and formulations.

BACKGROUND

In the production of packages and electronic devices, a semiconductor or micromechanical die will typically be soldered to a package substrate. The package substrate is typically soldered to a printed circuit board, such as a motherboard, daughter board or some other board. In these soldering operations, the entire die and substrate are heated to a solder reflow temperature. In later processing steps, parts may be heated to even higher temperatures. The heat may cause the die, the substrate, the package, or even a printed circuit board to warp. The warping is caused by a difference in coefficient of thermal expansion between one part of a component and another.

The parts that are soldered together have arrays of contacts that line up when the two parts are placed against each other. If one part warps more or less than another part, then the contacts do not line up and some contacts will be farther apart than other contacts. This puts stress on the solder that connects the contacts and can cause the solder connection to be broken or never made.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

Figure 1A:
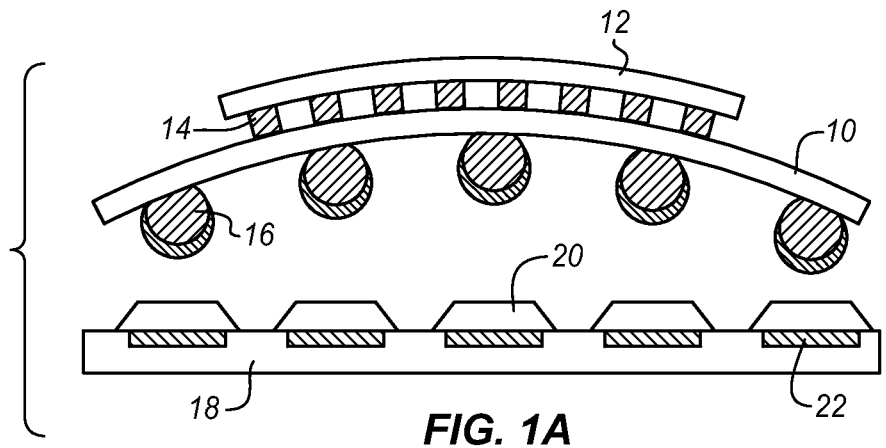
FIG. 1A is a simplified cross-sectional diagram of a part of a microelectronics package at room temperature according to an embodiment of the invention.

In some fabrication processes, solder balls are attached to dies or substrates by screen printing flux or loading low metal flux (less than 20 weight percent filler loading) and then placing solder balls onto pads on the substrate. This is then followed by heating in a solder reflow oven. As the pads become closer together, that is the pitch becomes smaller, the solder balls must be placed and held more precisely. In order to hold attach the solder balls, a paste process is used, however, the current paste process is very sensitive to warping in the package substrate. With some paste processes, the paste forms a cone shape at the center of a high warpage area and the solder balls may roll off the cones after being placed on a pad. This can cause the solder connection to form in the wrong location or not at all.

A low filler loading paste (50-80 weight percent) with a lower viscosity is more compliant to package warpage. This extends the current solder ball attach process to use with finer pitch (less than 0.4 mm) pads. The solder particles can be low temperature solder (LTS) powders, which melt at low temperature. These particles provide even better wetting and holding force for solder balls, such as SAC (SnAgCu) solder balls and further improve self-alignment. The benefits of the flux and paste process may be combined with better print quality (such as reduced coning in the center high warpage area) and high tackiness to hold the solder balls in place.

A BGA (Ball Grid Array) package, for example, normally has a convex shape warpage at room temperature. The warpage occurs after a die is attached due to a mismatch between the CTE (Coefficient of Thermal Expansion) of the silicon of the die and the organic material of the substrate. The die shrinks less at room temperature than the substrate does causing the convex shape shown in FIG. 1A. During the SMT (Surface Mount Technology) solder reflow process, the package is heated to melt the solder of the BGA. The substrate expands more than the die and the BGA package warpage starts to decrease. At around 150-180° C., the package warpage is very low as shown in FIG. 1B. Depending the package design and materials, as the substrate continues to expand faster than the die, the BGA package goes to a concave shape at SMT reflow temperature as shown in FIG. 1C.

This type of package warpage behavior significantly increases the risks of edge bumps being open (e.g. head and pillow or hanging ball defects) during the SMT solder reflow process with reflow temperature for SAC. The SAC and low temperature solder (LTS) hybrid structure has lower melting and solidification points for the hybrid compared to SAC balls, such as SAC405 and SAC305. With the increase of reflow temperature, the hybrid structure starts to melt and collapse at a lower temperature than the SAC balls and easily forms the interconnection between the bond pads. At the same time, due to lower solidification points than SAC, the joints will solidify at a lower temperature which corresponds to lower package warpage than SAC and improve the process warpage margin. On the other side of the joint, if LTS solder paste is printed on the board side, it melts at around 150-180° C., a temperature with the lowest package warpage. The molten LTS solder has a strong wetting force on the BGA solder balls and the substrate pads preventing open bumps.

Package on interposer (PoINT) is another product architecture. It uses a solder connection for an array of different types of interconnects. The interconnection between the top of the package and the interposer is called an MLI (middle level interconnect). The top package has a full reticle die on a large form factor thin core substrate. For such a package, both room temperature and reflow warpage are very high. This significantly increases the risk of open solder bump connections in the MLI when a regular SnAgCu (SAC) interconnect process is used.

Further increases in solder joint reliability (SJR) are possible by also using an underfill. The underfill also helps LTS MLI joints survive a higher temperature during an assembly process.

As described herein, a solder ball for soldering a die to a package substrate or an interposer can be formed as a dual solder sphere with an outer shell made of low melting temperature solder (LTS) and an inner core of higher melting temperature solder. This produces a hybrid structure that improves the ability of the solder to withstand a wider range of temperatures and physical warpage. The hybrid solder ball combines the low melting point property advantages from LTS that accommodate a package's dynamic warpage behavior with the higher temperature solder advantages of enhanced reliability at reflow temperatures. These advantages include greater resistance to physical shock and temperature cycles. The dual solder sphere can be made at low cost with an outer shell of low melting temperature solder and an inner core of higher melting temperature solder to produce a hybrid structure.

The low temperature solder may include any appropriate low temperature solder material, including but not limited to tin/bismuth/copper/nickel alloys and tin/bismuth/copper/antimony alloys. In another embodiment, the low temperature solder may be an off-eutectic (high tin) tin/bismuth/copper alloy, which may have a reflow temperature of less than about 175° C., as such alloys, particularly those having a tin concentration of between about 42% and 60% (having a liquidus range of between about 138° C. and 170° C.). In one embodiment, the low temperature solder may have a reflow temperature of less than about 200° C., and may be as low as less than about 170° C.

Figure 1B:
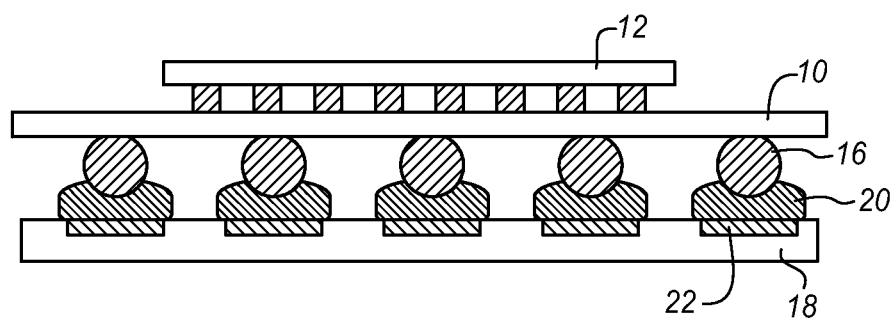
FIG. 1B is a simplified cross-sectional diagram of the part of a microelectronics package of FIG. 1A at a low temperature solder melting temperature according to an embodiment of the invention.
Figure 1C:
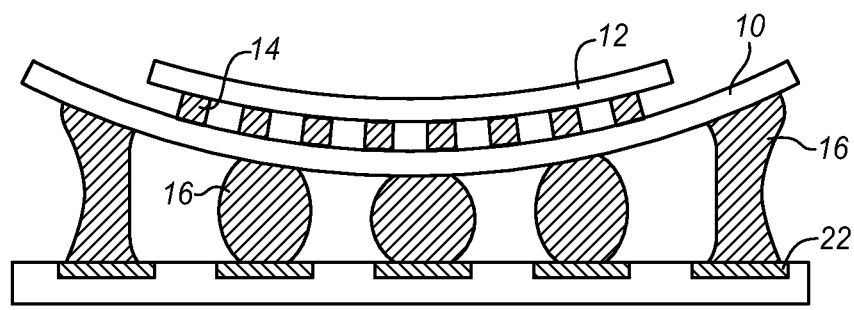
FIG. 1C is a simplified cross-sectional diagram of the part of a microelectronics package of FIG. 1A at solder reflow temperature according to an embodiment of the invention.

Referring to FIG. 1A a simplified cross-sectional diagram of a package at room temperature shows a package substrate 10. The substrate carries a die 12 that is attached with solder balls 16 or any other material. The package may have additional layers, dies, covers, coolers, connectors, and other structures that are not shown in order to simplify the drawing. The package substrate 10 is to be attached to a printed circuit board (PCB), such as a motherboard 18 or another package substrate, depending on the particular implementation. Solder balls, in this case dual solder hybrid spheres 16, are attached, for example using solder paste, to connection pads on the package substrate. On the PCB 18, an LTS 20 has been applied as a paste to an array of connection pads 22 that will then connect with the package substrate solder balls. As shown, the package is warped at room temperature and is convex with respect to the PCB.

The package may be used to carry and protect any of a variety of different types of dies 12, such as a microprocessor, a chipset, a graphics device, a wireless device, a memory device, an application specific integrated circuit, or the like, attached to a substrate 10 or an interposer through an array of interconnects such as reflowable solder bumps or balls, in any of a variety of different configurations including flip-chip or controlled collapse chip connection (C4). The interconnects may be between bond pads on an active surface of the microelectronic device and bond pads on the microelectronic interposer or substrate. The microelectronic device bond pads are typically in electrical communication with integrated circuitry (not shown) within the die. The interposer or substrate typically has multiple conductive routes extending from the bond pads to a bond pad on the opposite surface. The interposer or substrate may reroute a fine pitch (pitch corresponds to a center-to-center distance between the microelectronic device bond pads) of the bond pads on one surface for the die to a relatively wider pitch on the opposite side.

Referring to FIG. 1B showing the same simplified diagram of a package but at a higher temperature, when SMT (Surface Mount) reflow temperature reaches 150° C.-180° C., the LTS paste 20 starts melting. The BGA package 18 also has the lowest warpage at this temperature. The molten LTS 20 will completely wet the board SRO (solder resist opening) pads 22 and BGA (Ball Grid Array) package balls 16.

Referring to FIG. 1C after the same package 10 is soldered to the PCB 18 and is further heated, the package warps in the opposite direction. In this example, the package is heated to 230° C.-240° C. At this temperature, the package is now convex with respect to the PCB. Due to the strong wetting force, the molten solders either prevent the package from further warping or the molten solders get stretched. In either case, the joint formed by the initial soldering is maintained. This allows the joint to sustain higher temperatures with higher reliability. The particular amount of warpage, the reflow temperatures and the composition of the solders, the hybrid structures and the paste may be adapted to suit particular implementations. Conventional ball attach, solder paste, and solder reflow techniques may be adapted for use with the approaches described herein.

On the other hand, the LTS can suppress the solidification point of the hybrid materials. The liquid solders solidify at lower temperature, which provides more opportunity for joint formation due to the low package warpage at lower temperature (150-180° C.) as shown in FIG. 1B. The new alloy formed after the SMT process is able to improve solder joint reliability performance and increase the melting point over a solder joint formed using only LTS In some embodiments of the invention, a SAC and LTS hybrid structure is used to improve an MLI (Middle Level Interposer) process window as compared to a pure SAC MLI process. The SJR performance may be improved and the melting point of the MLI joints may be increased. The melting point temperature is increased by taking advantage of the properties of the hybrid materials.

Figure 2A:
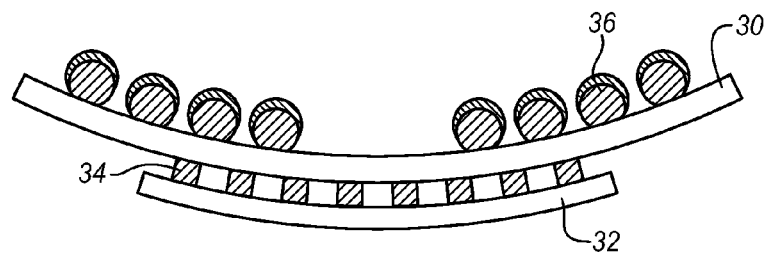
FIG. 2A is a simplified cross-sectional diagram of a part of a PoINT package at room temperature after ball attach according to an embodiment of the invention.

FIG. 2A shows a cross sectional simplified diagram of a portion of a PoINT package. A package substrate 30 carries a die 32 that is attached by solder balls 34 C4 (Controlled Collapse Chip Connection) balls or some other device. An array of hybrid solder balls 36 are attached to the substrate 30 for example by pasting. At room temperature, as shown in FIG. 2A, the substrate is warped to a convex shape. For a SAC/LTS hybrid MLI process, when the MLI process reflow temperature reaches 150-180° C., the LTS starts melting and the top package has the lowest warpage at this temperature. FIG. 2A is a cross sectional diagram of the simplified package at this temperature.

During the BA (Ball Attach) process, LTS paste (not shown) may be printed on top of the BGA package SRO pads. The SAC balls may then be placed over the paste. The package may then be exposed to a low temperature reflow to melt the LTS solder, holding the SAC balls in place as shown. SAC405 balls, for example, don't melt during low temperature reflow. When at MLI, a SAC reflow process may be used to form a uniform alloy by first melting the LTS and then melting the SAC balls.

Figure 2B:
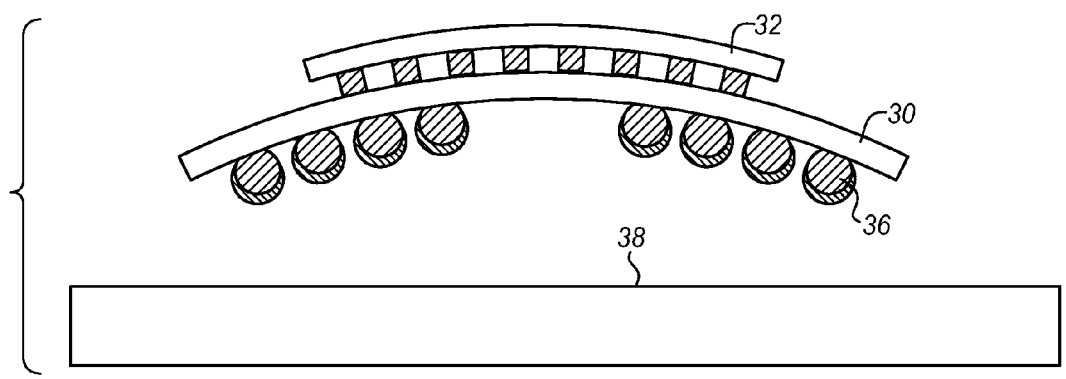
FIG. 2B is a simplified cross-sectional diagram of a part of a PoINT package of FIG. 2A flipped for attachment to an interposer according to an embodiment of the invention.
Figure 2C:
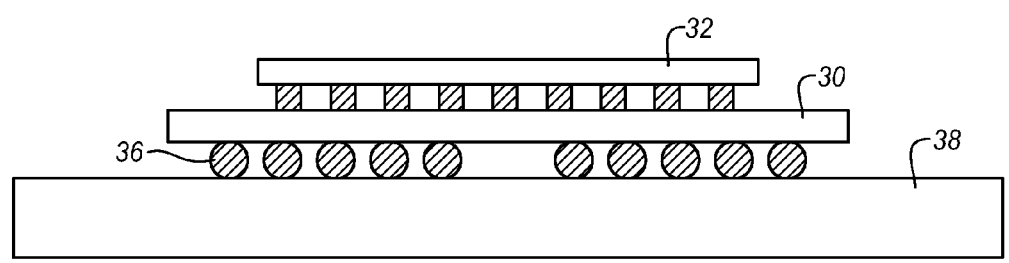
FIG. 2C is a simplified cross-sectional diagram of a part of a PoINT package of FIG. 2A attached to the interposer according to an embodiment of the invention.

FIG. 2B shows the package substrate 30 with balls 36 attached flipped and heated to a higher reflow temperatures such as 150-180° C. for attachment to an interposer 38. After this, the MLI process continues as shown in FIG. 2C to a higher reflow temperature such as 240° C. to form the solder joint. This joint can then be cured by cooling to form the reliable solder joint connection described above.

The process robustness is boosted further by printing LTS solder paste on the substrate before attaching the hybrid solder balls to the substrate. Such a paste may melt at around 150-180° C., a temperature with very low or the lowest amount of substrate warpage. The molten LTS solder paste at this temperature has a strong wetting force on the BGA solder balls and the substrate pads. This helps to hold the solder balls in place and prevents them from moving away from their pads which would cause open bumps.

Figure 3:
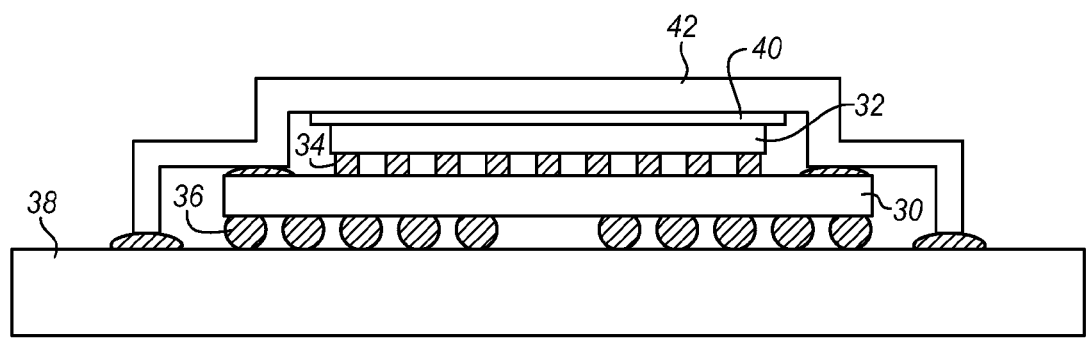
FIG. 3 is a simplified cross-sectional diagram of a PoINT package formed as in FIGS. 2A, 2B, and 2C according to an embodiment of the invention.

FIG. 3 is a cross-sectional diagram of a simplified PoINT package formed using the operations shown in FIGS. 2A through 2C. The die 32 remains soldered to the package substrate 30 with a first set of solder joints 34. The substrate is soldered to the interposer 38 using an array of hybrid solder balls 36. The package is finished with a heat conducting backer 40 adhered to the back side of the die 32 and a lid 42 attached to the interposer 38 to cover all of the internal components and protect the internal components from damage. The lid may also act as a heat conductor to draw heat away from the die to the outside environment.

As described above, after the LTS has melted, at about 150-170° C. the package continues to warp as the temperature increases. At 150 to 217° C. (the melting point of a SAC405 solder ball), the molten LTS joints in the corners of a substrate or interposer will stretch. The amount of stretching reduces for solder joints closer to the center of the two surfaces. The flux will contribute little to no volume to the joint that forms. It is a metal joint.

Figure 4:
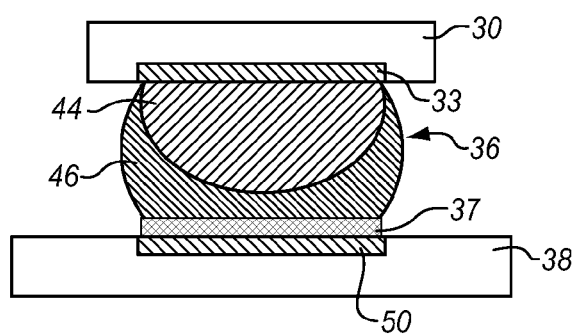
FIG. 4 is a cross-sectional diagram of a fully assembled hybrid solder ball prior to reflow according to an embodiment of the invention.

FIG. 4 is a cross-sectional diagram of a fully assembled hybrid solder ball prior to reflow. Assembly paste 37 is applied to a SRO (Solder Resist Opening) pad 50 of a PCB 38 or other substrate to which a connection is to be made. The pad typically is coupled to vias and electrical connection pathways (not shown) within the substrate to make electrical connections with other components. The hybrid solder ball 36 is attached to the SRO by the paste. Typically there are hundreds of solder balls attached to any one substrate. An upper substrate 30, such as a package substrate, an interposer, a die, or any other substrate, has a plating layer 33, such as an SRO that contacts the solder ball. The contact plates of the upper substrate are arranged so that when the upper substrate is aligned over the substrate, the plates and the solder balls align to make all of the intended connections. The solder ball 36 as described above is a high temperature solder ball 44 with an LTS coating 46.

The assembly is then ready for heating in, for example, a reflow furnace. After heating, the high and low temperature parts of the hybrid solder ball combine to form a single solder ball that is roughly a homogeneous mixture. The amount of heating required may be less than the melting point of the high temperature center of the solder ball. With heating, one or both substrates 30, 38 will warp and the distance between the two will change in an amount that depends on the distance from the center of the substrate and the temperature. The heat and movement may cause the solder balls to move with respect to the SROs. With sufficient warpage, a solder ball may be moved so far that it no longer is able to electrically connect the package plating and the SRO. A paste as described in more detail below may prevent such a loss of a connection.

Figure 5:
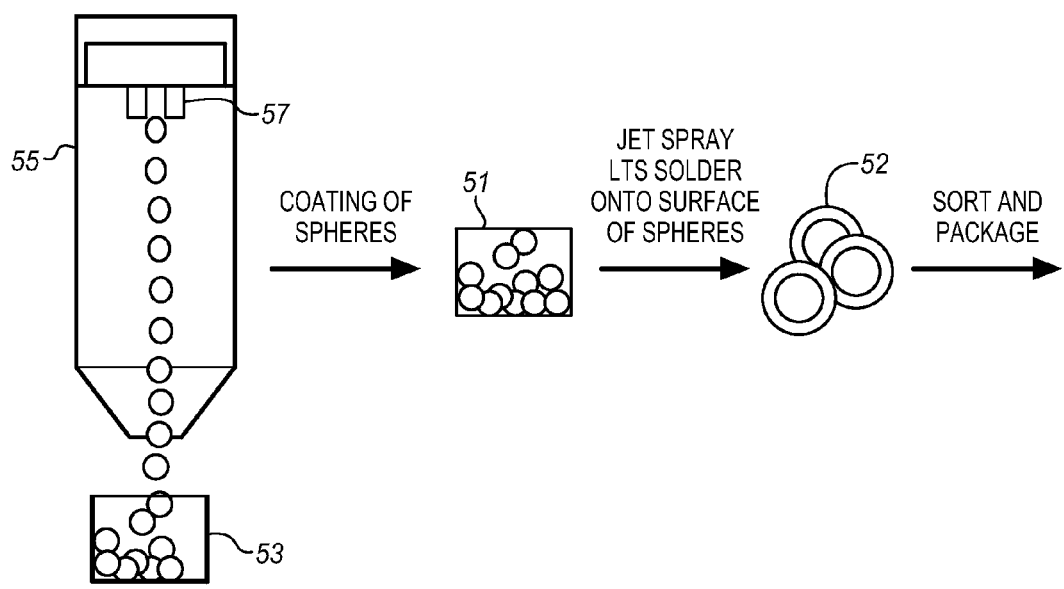
FIG. 5 is a diagram of a process for producing hybrid solder balls according to an embodiment of the invention.

FIG. 5 is a diagram of a process for producing the hybrid solder balls as shown and described above. A solder droplet injection nozzle 57 produces solder droplets using molten SAC405, SAC305 or a similar solder material. The droplet frequency is regulated to determine the diameter of each droplet. In the examples above, the droplets are about 300 μm in diameter, however, the particular size may be adapted to suit any particular implementation. The droplets are dispersed into a sealed tower 55 filled, for example, with $N_2$ or another oxygen-poor environment to limit the growth or any oxide layer on the outer surface of each droplet. In the tower, the droplets at 51 are then sprayed with a wetting or coating agent to improve the bond between the two different types of solders. The spray is applied to coat the spheres or droplets At 52, the coated spheres are jet-sprayed with an LTS solder to coat the surface of the spheres. Any LTS as described herein may be sprayed onto the droplets to form hybrid solder balls. The coated spheres are allowed to cool and are then sorted and packaged for later use. The finished solder balls 53 may be used in any of a variety of different ways. As described below, the hybrid solder balls may be placed on flux that has been screen printed over substrate pads.

A chemical interface may be added at 51 between the solder coating and the droplet or solder ball sphere. This may be sprayed, deposited, or applied using a plasma, dipping or any other suitable method. The interface may be a chemical interface through which substitution or interstitial bonding is able to control the bond strength between the solder ball droplet interior and the lower temperature solder exterior coating. Such applications as Pd activation using alkaline or colloidal methods may be applied to enable an adhesion interface. A variety of other and additional interfaces may also be used, depending on the desired properties and cost constraints.

Solder paste may be used to attach the hybrid solder balls to a bond pad, SRO or other location on a substrate or PCB. A solder paste material may be made with lower filler loading (50-80 weight percent), lower viscosity, and using low temperature solder particles, for example solder particles that melt below 200° C. This paste improves self-alignment during reflow and allows ball attach processes to be used with a ball grid array with a pitch lower than 0.4 mm, although the paste may also be used for higher pitches as well.

Figure 6A:
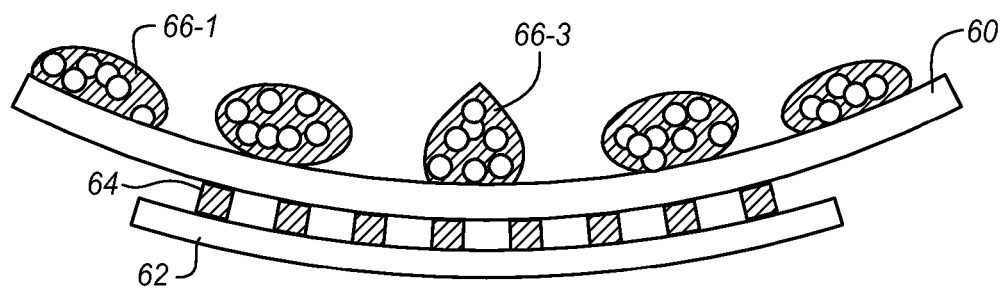
FIG. 6A is a cross-sectional diagram of a warped package substrate with solder paste applied according to an embodiment of the invention.
Figure 6B:
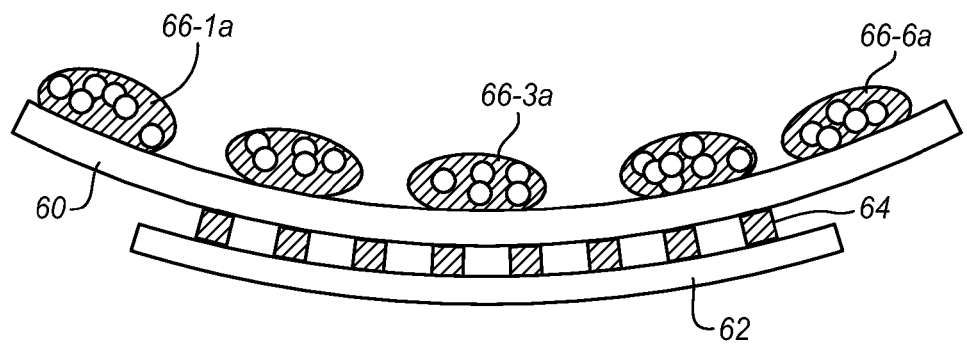
FIG. 6B is a cross-sectional diagram of the warped package substrate of FIG. 6A after some time has elapsed according to an embodiment of the invention.

With the lower viscosity paste, even though a coning shape may be formed after the paste is printed in high warpage areas, the paste spreads out quickly and forms a flat top surface. This spreading out is shown in the diagram of FIG. 6B. FIG. 6A is a cross-sectional diagram of a substrate 60 subject to warpage. A die 62 is attached to the substrate with solder balls 64, such as C4 connections. Solder paste 66-1 has been applied to the substrate to attach the substrate to another set of bond pads such as on an interposer, a package substrate or a PCB. When the solder paste is first applied as shown in FIG. 6A, the solder paste 66-1, 66-3 near the center of the substrate warpage is subject to coning as shown for the center paste 66-3. With time, however, a low viscosity paste spreads out as shown in FIG. 6B in which the central paste 66-3a has spread out and has a shape similar to that of the rest of the paste 66-1a, 66-6a.

Figure 6C:
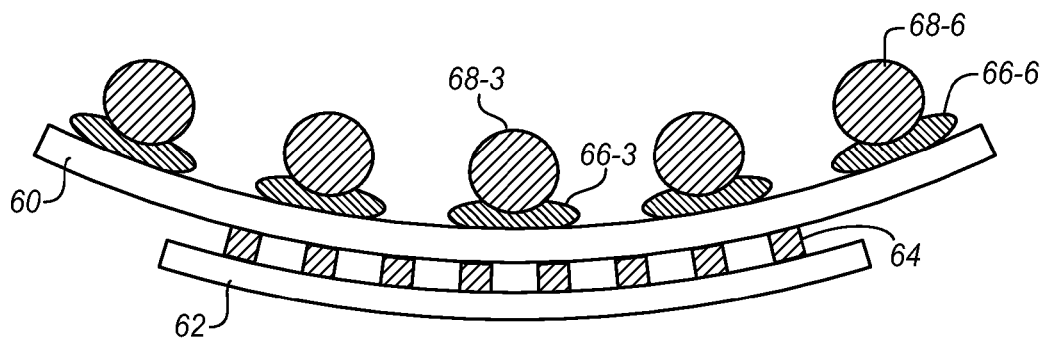
FIG. 6C is a cross-sectional diagram of the warped package substrate of FIG. 6A after ball attach according to an embodiment of the invention.

This lower viscosity is more compliant to package warpage and improves ball placement accuracy and ball attach yield. Instead of a filler loading of from 88-90 weight percent with high viscosity, a lower filler loading such as 50-80 weight percent may be used. With a higher viscosity, after printing, the paste may form a cone shape in the center of a high warpage area. When a solder ball placement tool drops a ball over a coning shape paste, the ball will tend to roll off and merge with other balls, bridge two different connections, or worse. FIG. 6C shows solder ball 68-3-68-6 placement in the low viscosity paste 66-3, 66-6. As shown, the solder balls 68 are well centered on their respective pads by the paste 66 and there is little risk of rolling off or movement.

A low filler loading paste with lower viscosity reduces the risk that a solder ball will roll off a pad due to coning of the paste. This can be combined with an LTS. The low melting point properties of the lower viscosity paste allow solder balls to be successfully attached over a wider range of temperatures even for fine pitch singulated packages. The results include better print quality, higher tackiness and also better self-alignment during the reflow process.

At the same time, due to the LTS particles in the paste materials, the paste can melt at low temperature, provide more wetting and holding force to the solder balls and better self-alignment during a reflow process. This allows ball attach processes to be used with fine pitch and high warpage products.

Figure 7A:
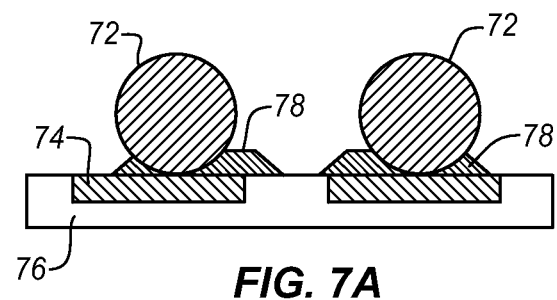
FIG. 7A is a cross-sectional diagram of solder balls on SRO pads of a substrate according to an embodiment of the invention.

FIG. 7A is a cross-sectional diagram of solder balls 72 on SRO pads 74 of a substrate. The balls are held to the pads using a solder paste 78. The paste is applied over the substrate using printing and the solder balls are placed over the printed paste. As shown in FIG. 7A, the balls are roughly centered over the paste at ambient temperature before the substrate is placed in a reflow oven.

Figure 7B:
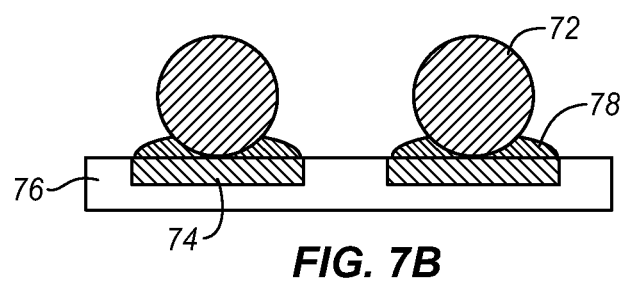
FIG. 7B is a cross-sectional diagram of the solder balls of FIG. 8A heated to a low temperature solder melting point according to an embodiment of the invention.

FIG. 7B is a cross-sectional diagram of the same solder balls 72 and substrate 76 after the assembly has been heated to an LTS melting temperature but below the reflow temperature. The LTS of the paste 78 has melted. This provides more wetting and more holding force to the solder balls. If the solder balls are coated hybrid solder balls, as described above, then the LTS of the solder balls may also have melted to further hold the SAC portion of each solder ball in place. The molten LTS provides a self-alignment effect to the solder balls on the SRO pads.

Figure 7C:
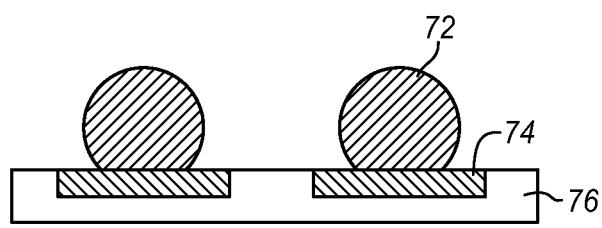
FIG. 7C is a cross-sectional diagram of the solder balls of FIG. 8C heated to a reflow temperature according to an embodiment of the invention.

FIG. 7C is a cross-sectional diagram of the same solder balls at the reflow temperature. In FIGS. 7A, 7B, and 7C, the warpage is not shown in order to simplify the drawing. At the reflow temperature, the strong wetting and holding force of the low viscosity, LTS solder filled paste holds the solder balls 72 in place as the solder reflows to form a solid electrical connection with the substrate and another component (not shown) above the solder balls.

As described above, the paste filler may be LTS particles. The particles may be solder powder and can include solder metal, including metal alloys, having particle sizes ranging from 50 nanometers to 50 micrometers. Representative alloys include tin-rich alloys such as Sn—XAg—XCu, Sn—XCu, Sn—XAg, Sn—XAg—XBi, Sn—XAg—XBi—XIn, Sn—XAg—XIn, Sn—XAg—XBi—XZn. Other low melting point powders can be included that encompass a reflow temperature in the range of 120° C. to 300° C.

The paste may also include any number of different solder fluxes. In some embodiments, the solder flux includes 20 percent to 45 percent by weight of a rosin material. A suitable flux includes one that is a mixture of the rosin with additional raw materials including, but not limited to, one or more organic acids, amines, solvents, activators and other additives.

Suitable organic acids include, but are not limited to, mono-, di-, tri-carboxylic acid having between two and 40 carbon atoms. Examples of suitable organic acids include, but are not limited to, glycolic acid, oxalic acid, succinic acid, malonic acid and the like or their combinations. Suitable amines include primary, secondary and tertiary amines including four to 40 carbon atoms. Representative examples of suitable amines include, but are not limited to, butyl amine, diethylbutyl amine, dimethylhexyl amine and the like or their combinations. Suitable solvents include a wide variety of solvents as known in the solder flux industry. Suitable activators include halogenated and non-halogenated activators.

A composition of the solder paste described and used in the applications described herein may include a mixture of a flux such as the flux described herein together with a solder powder. The solder paste may contain flux in a range of from about 10 weight percent to 90 weight percent. The solder powder may be in a range of from about 5 weight percent to 80 weight percent.

Figure 8:
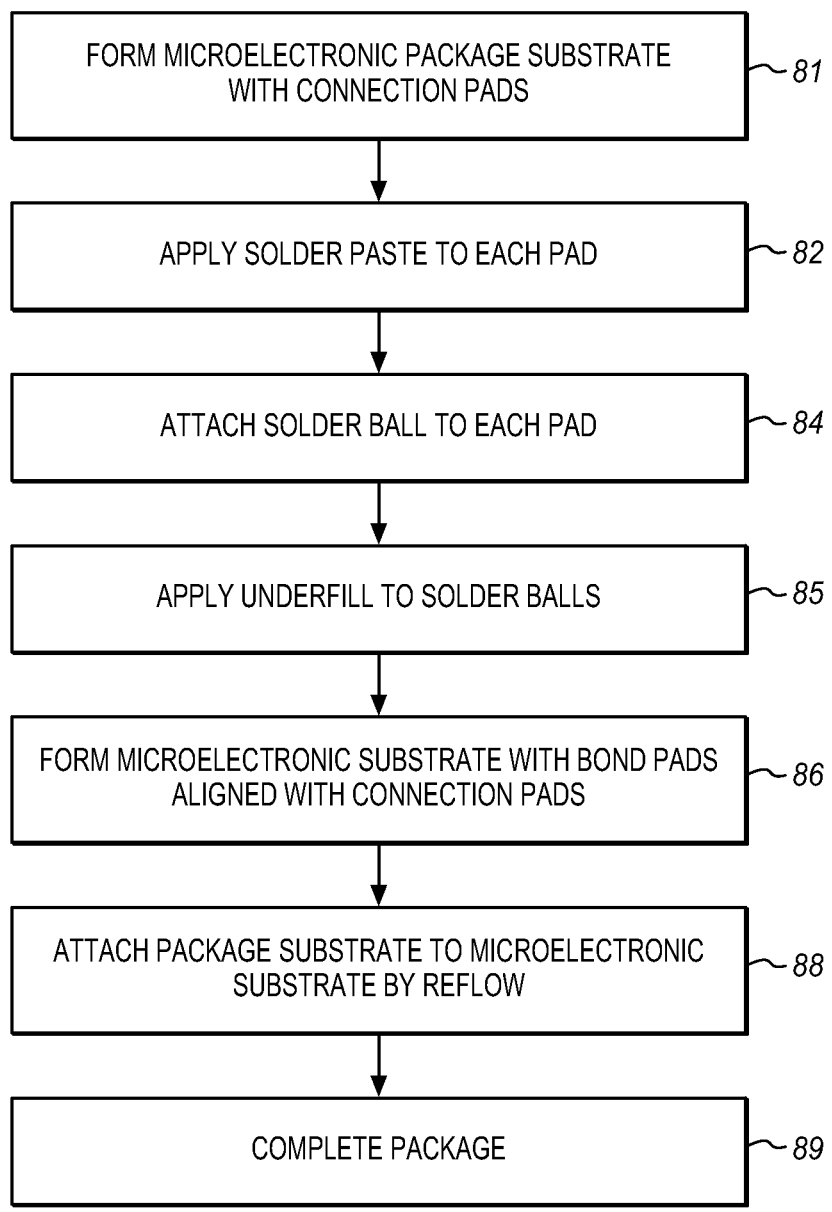
FIG. 8 is a process flow diagram of forming a microelectronic package according to an embodiment of the invention.

FIG. 8 is a process flow diagram for using the hybrid solder balls and solder paste described herein to form a microelectronic structure such as a PoINT package or another type of package or other structure. The process uses components that include two substrates with pads that are aligned so that they may be electrically connected using solder between aligned pads. In the examples above, a plurality of solder resist opening pads, are provided on each substrate, however, other types of pads may be used.

At 81, a microelectronic package substrate is formed. The package substrate is formed with a plurality of connection pads. The pads are typically in an array and may be solder resist opening pads or pads of any other desired type. At 82 solder paste is applied to each pad of one of the substrates. The paste may be a paste as described above, such as a low viscosity paste with particle loading below 80% or even at about 45%, or any other suitable type of paste may be used, depending on the particular implementation. The paste may be applied by jet printing, screen printing, or in any of a variety of other ways. At 84, a solder ball is attached to each pad using the paste. The solder ball may be a hybrid solder ball as described herein having a high temperature solder interior and a low temperature solder exterior. Any one or more of the features of the solder balls described herein may be used.

At 85, an underfill is optionally applied to and around the solder balls to provide additional isolation and bonding before the solder is melted to connect the package substrate to the other substrate.

At 86, a microelectronic substrate is formed with a plurality of microelectronic substrate bond pads. These bond pads are aligned with the plurality of connection pads, such as solder resist opening pads of the package substrate. For a PoINT package, this second substrate may an interposer. For other types of packages, this second substrate may be a die substrate, an interconnection substrate to make a connection with another die or package or any other substrate depending on the particular embodiment. While the formation of this substrate is indicated as being after the attachment of the solder balls and application of underfill, this substrate may be formed much earlier and even before the package substrate is formed.

At 88, the microelectronic package substrate is attached to the second, microelectronic, substrate by reflowing the hybrid solder balls to form a hybrid solder interconnect extending between each package substrate solder resist opening pad and each respective microelectronic substrate bond pad. Typically, in the reflow furnace, the two substrates are aligned and clamped together. The assembly is first heated to above a low temperature solder melting point. The hybrid solder ball exterior coating wets the solder and holds the solder balls to the paste. The reflow furnace is further heated to above a high temperature solder melting point. This temperature forms the hybrid solder interconnect. At 89, the package is completed, for example by attaching other dies or substrates, by attaching a cover to the package substrate, by applying a dielectric compound over the substrate, or in any other way depending on the particular embodiment.

Figure 9:
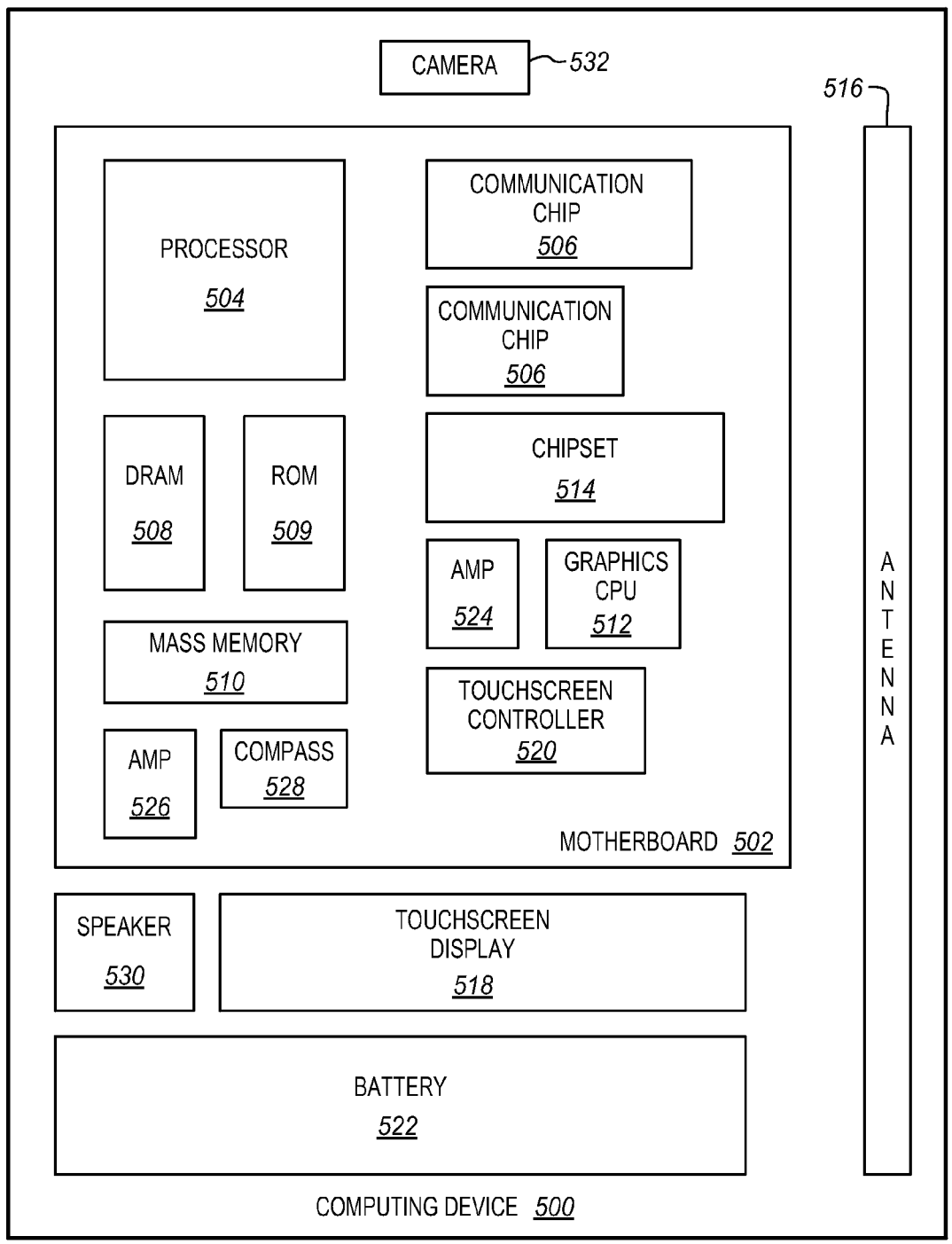
FIG. 9 is a block diagram of a computing device incorporating a microelectronic package according to an embodiment of the invention.

FIG. 9 illustrates a computing device 500 in accordance with one implementation of the invention. The computing device 500 houses a board 502. The board 502 may include a number of components, including but not limited to a processor 504 and at least one communication chip 506. The processor 504 is physically and electrically coupled to the board 502. In some implementations the at least one communication chip 506 is also physically and electrically coupled to the board 502. In further implementations, the communication chip 506 is part of the processor 504.

Depending on its applications, computing device 500 may include other components that may or may not be physically and electrically coupled to the board 502. These other components include, but are not limited to, volatile memory (e.g., DRAM) 508, non-volatile memory (e.g., ROM) 509, flash memory (not shown), a graphics processor 512, a digital signal processor (not shown), a crypto processor (not shown), a chipset 514, an antenna 516, a display 518 such as a touchscreen display, a touchscreen controller 520, a battery 522, an audio codec (not shown), a video codec (not shown), a power amplifier 524, a global positioning system (GPS) device 526, a compass 528, an accelerometer (not shown), a gyroscope (not shown), a speaker 530, a camera 532, and a mass storage device (such as hard disk drive) 510, compact disk (CD) (not shown), digital versatile disk (DVD) (not shown), and so forth). These components may be connected to the system board 502, mounted to the system board, or combined with any of the other components.

The communication chip 506 enables wireless and/or wired communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless or wired standards or protocols, including but not limited to Wi-Fi (WEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, Ethernet derivatives thereof, as well as any other wireless and wired protocols that are designated as 3G, 4G, 5G, and beyond. The computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

The processor 504 of the computing device 500 includes an integrated circuit die packaged within the processor 504. In some implementations of the invention, the integrated circuit die of the processor, memory devices, communication devices, or other components include one or more dies that are packaged using hybrid solder balls, low viscosity paste or both allowing for lower reflow temperatures, if desired. The term "processor" may refer to any device or portion of a device that processes electronic data from registers and/or memory to transform that electronic data into other electronic data that may be stored in registers and/or memory.

In various implementations, the computing device 500 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

Embodiments may be implemented as a part of one or more memory chips, controllers, CPUs (Central Processing Unit), microchips or integrated circuits interconnected using a motherboard, an application specific integrated circuit (ASIC), and/or a field programmable gate array (FPGA).

References to "one embodiment", "an embodiment", "example embodiment", "various embodiments", etc., indicate that the embodiment(s) of the invention so described may include particular features, structures, or characteristics, but not every embodiment necessarily includes the particular features, structures, or characteristics. Further, some embodiments may have some, all, or none of the features described for other embodiments.

In the following description and claims, the term "coupled" along with its derivatives, may be used. "Coupled" is used to indicate that two or more elements co-operate or interact with each other, but they may or may not have intervening physical or electrical components between them.

As used in the claims, unless otherwise specified, the use of the ordinal adjectives "first", "second", "third", etc., to describe a common element, merely indicate that different instances of like elements are being referred to, and are not intended to imply that the elements so described must be in a given sequence, either temporally, spatially, in ranking, or in any other manner.

The drawings and the forgoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, orders of processes described herein may be changed and are not limited to the manner described herein. Moreover, the actions of any flow diagram need not be implemented in the order shown; nor do all of the acts necessarily need to be performed. Also, those acts that are not dependent on other acts may be performed in parallel with the other acts. The scope of embodiments is by no means limited by these specific examples. Numerous variations, whether explicitly given in the specification or not, such as differences in structure, dimension, and use of material, are possible. The scope of embodiments is at least as broad as given by the following claims.

The following examples pertain to further embodiments. The various features of the different embodiments may be variously combined with some features included and others excluded to suit a variety of different applications. Some embodiments pertain to a hybrid solder ball for use in a ball grid array that has a droplet of higher temperature solder and a coating of lower temperature solder. The higher temperature solder may be a lead-free alloy and may have a has a melting point above 200° C. The lower temperature solder may be an alloy including tin, bismuth, and copper and have a melting point below 200° C.

The coating may cover the entire exterior surface of the droplet. There may be an interface material between the droplet and the coating. The interface material may control bond strength between the droplet and the coating using at least one of substitution and interstitial bonding. The interface material interface may comprise Pd applied using at least one of an alkaline or colloidal method.

Other embodiments pertain to a solder structure with a bond pad of a microelectronic device, a solder paste on the bond pad, a hybrid solder ball having a high temperature solder interior and a low temperature solder exterior, and a low temperature solder disposed between the bond pad and the hybrid solder ball. The low temperature solder exterior may cover the entire exterior surface of the hybrid solder ball. The low temperature solder may be a coating over the high temperature solder interior. The solder paste may contain a low temperature solder filler that may be less than 80 weight percent of the solder paste. The low temperature solder of the hybrid solder ball may be the same material as the low temperature solder of the solder paste. In some embodiments, the bond pad is a solder resist opening bond pad.

Other embodiments pertain to a solder paste for attaching a solder ball to a bond pad for a reflow furnace, the solder paste has an adhesive, and a filler of low temperature solder particles, the filler comprising less than 80 weight percent of the paste. The filler may be metal solder alloy and may have particle sizes within a range from 50 nm to 50 µm. The filler may be a tin-rich alloy and may be at least one of Sn—XAg—XCu, Sn—XCu, Sn—XAg, Sn—XAg—XBi, Sn—XAg—XBi—XIn, Sn—XAg—XIn, and Sn—XAg—XBi—XZn.

The filler may be a low melting point powder having a melting point below 200° C. The solder paste may have a solder flux having 20% to 45% by weight of a rosin material. The solder flux may have at least one of organic acids, amines, solvents, and activators.

Other embodiments pertain to fabricating a microelectronic structure, by forming a microelectronic package substrate having a plurality of connection pads, applying a solder paste to each pad, attaching a hybrid solder ball to each pad using the paste, the hybrid solder ball having a high temperature solder interior and a low temperature solder exterior, forming a microelectronic substrate having a plurality of microelectronic substrate bond pads aligned with the plurality of connection pads, and attaching the package substrate to the microelectronic substrate by reflowing the hybrid solder balls to form a hybrid solder interconnect extending between each microelectronic connection pad and each respective microelectronic substrate bond pad.

In some embodiments reflowing comprises first heating the hybrid solder balls to a reflow temperature of the low temperature solder exterior to wet the solder and second heating the hybrid solder balls to a reflow temperature of the high temperature solder interior to form the hybrid solder interconnect. In some embodiments, applying a solder paste comprises printing a solder paste having low temperature solder particles. Some embodiments also include applying an underfill to the solder balls before reflowing.

What is claimed is:

1. A solder structure comprising:
   a bond pad of a microelectronic device;
   a solder paste on the bond pad; and
   a hybrid solder ball having a high temperature solder interior and a low temperature solder exterior,
   wherein the solder paste comprises a low temperature solder disposed between the bond pad and the hybrid solder ball.

2. The structure of claim 1, wherein the higher temperature solder comprises a lead-free alloy.

3. The structure of claim 1, wherein the higher temperature solder has a melting point above 200° C.

4. The structure of claim 1, wherein the lower temperature solder comprises an alloy including tin, bismuth, and copper.

5. The structure of claim 1, wherein the lower temperature solder has a melting point below 200° C.

6. The structure of claim 1, wherein the coating covers the entire exterior surface of the droplet.

7. The structure of claim 1, further comprising an interface material between the droplet and the coating.

8. The structure solder ball of claim 7, wherein the interface material is configured to control bond strength between the droplet and the coating using at least one of substitution and interstitial bonding.

9. The structure solder ball of claim 8, wherein the interface material interface comprises Pd applied using at least one of an alkaline or colloidal method.

10. The solder structure of claim 1, wherein the solder paste contains a low temperature solder filler.

11. The solder structure of claim 10, wherein the filler is less than 80 weight percent of the solder paste.

12. The solder structure of claim 11, wherein the low temperature solder of the hybrid solder ball is the same material as the low temperature solder of the solder paste.

13. The structure of claim 1 A solder paste for attaching a solder ball to a bond pad for a reflow furnace, the solder paste comprising:
   an adhesive; and
   a filler of low temperature solder particles, the filler comprising less than 80 weight percent of the paste.

14. The solder paste of claim 13, wherein the filler comprises particle sizes within a range from 50 nm to 50 µm.

15. The solder paste of claim 13, wherein the filler comprises a metal solder alloy.

16. The solder paste of claim 15, wherein the alloy comprises at least one of Sn—XAg—XCu, Sn—XCu, Sn—XAg, Sn—XAg—XBi, Sn—XAg—XBi—XIn, Sn—XAg—XIn, and Sn—XAg—XBi—XZn.

* * * * *